(12) United States Patent
Boutaghou et al.

(10) Patent No.: US 6,710,417 B2
(45) Date of Patent: Mar. 23, 2004

(54) ARMOR COATED MEMS DEVICES

(75) Inventors: Zine-Eddine Boutaghou, Vadnais Heights, MN (US); Roger L. Hipwell, Jr., Eden Prairie, MN (US); Wayne A. Bonin, North Oaks, MN (US)

(73) Assignee: Seagate Technology LLC, Bloomington, MN (US)

( * ) Notice: Subject to any disclaimer, the term of this patent is extended or adjusted under 35 U.S.C. 154(b) by 0 days.

(21) Appl. No.: 10/055,688

(22) Filed: Jan. 23, 2002

(65) Prior Publication Data

US 2003/0057412 A1 Mar. 27, 2003

Related U.S. Application Data

(60) Provisional application No. 60/325,839, filed on Sep. 27, 2001.

(51) Int. Cl.[7] .............................................. H01L 29/82
(52) U.S. Cl. ....................... 257/415; 257/417; 257/418; 257/420
(58) Field of Search ................................ 257/415, 417, 257/418, 420

(56) References Cited

U.S. PATENT DOCUMENTS

| | | | |
|---|---|---|---|
| 3,868,849 A | 3/1975 | Hunyar | 73/100 |
| 4,571,661 A * | 2/1986 | Hoshino | 361/283 |
| 5,786,621 A | 7/1998 | Saif et al. | |
| 5,869,768 A | 2/1999 | Sato et al. | 73/783 |
| 5,882,435 A | 3/1999 | Holdermann | 136/261 |
| 5,966,066 A * | 10/1999 | Mehregany et al. | 337/70 |
| 6,051,866 A * | 4/2000 | Shaw et al. | 257/417 |
| 6,404,028 B1 * | 6/2002 | Hetrick et al. | 257/415 |

OTHER PUBLICATIONS

Singh, Angad et al., Batch Transfer of Microstructures Using Hip–Chip Solder Bump Bonding.

Maharbiz, Michael et al., Batch Micropackaging by Compression–Bended Water–Wafer Transfer.

* cited by examiner

Primary Examiner—Ngân V. Ngô
(74) Attorney, Agent, or Firm—Kinney & Lange, P.A.

(57) ABSTRACT

A method of improving the robustness of microcomponents formed of silicon by armor coating the microcomponent with a ductile material, such as a metal. The armored coating may comprise either partial armored coating or total armored coating. Providing the microcomponent with an armored coating reduces chipping and breaking, and likewise reduces contamination problems which arise from chips and breaks.

21 Claims, 4 Drawing Sheets

ARMOR COATED MEMS DEVICES

CROSS-REFERENCE TO RELATED APPLICATION(S)

This application claims priority from provisional application serial No. 60/325,829, filed on Sep. 27, 2001, and entitled "ARMOR COATED MEMS DEVICES" by Zine-Eddine Boutaghou, Roger Lee Hipwell Jr., and Wayne Allen Bonin, which is herein incorporated by reference.

BACKGROUND OF THE INVENTION

The present invention relates to a method of increasing the robustness of microcomponents formed of silicon. In particular, the present invention relates to coating the microcomponents with a ductile metal to increase their robustness.

Many micro-electro-mechanical systems (MEMS) devices and other microcomponents are formed of silicon or other brittle materials. Though extremely brittle, silicon has become the industry standard for several reasons. First off, because of modern etching techniques, it is possible to form very precise microcomponents by etching them from silicon. As a result, much of the equipment and processing in many microcomponents facilities are configured for working with silicon.

In addition, the MEMS industry is influenced by and follows the semiconductor industry. The semiconductor industry has used silicon in making its components, and as a result, has perfected techniques for working with silicon. Furthermore, if the MEMS device has electrical connections or is to be integrated into other electrical components, it is preferable that the MEMS device be made of silicon.

Though silicon is a relatively strong material, it is also very brittle. When handling a MEMS device made of silicon, the MEMS device will typically come into contact with such traditional tools as tweezers, robot pick and place tools, and pin contacts. Any time the silicon MEMS device is contacted by one of these tools, stress concentrations at the location of contact may be created. These locations are very susceptible to chipping, cracking, or even breaking due to the increased stress concentrations.

When a silicon component is chipped during handling, the small amounts of silicon which chip off may contaminate nearby electrical components. Should the silicon device crack during handling, there is an increased likelihood that the entire device will break. This is because MEMS devices are often formed of a single silicon crystal. Once the single crystal is cracked, the crack may easily develop into a major break. Contamination can also result from cracks and breaks. Further, should the silicon MEMS device crack, chip, or break, the device may no longer be useful.

Therefore, there is a need in the art to form silicon microcomponents and MEMS devices in such a way that their robustness can be increased so that there is less breakage and less contamination caused due to chipping, cracking, or breaking.

BRIEF SUMMARY OF THE INVENTION

The present invention is a silicon microcomponents or MEMS device which is coated with a ductile metal at a contact interface. The silicon microcomponents or MEMS devices having this armored coating are much more robust, less prone to breakage, and less likely to chip. The armored coating of the MEMS device may comprise either partial armored coating or total armored coating. Total armored coating comprises coating the entire device with the metal, while partial armored coating involves coating the MEMS device with metal at only desired locations, such as the locations which will be contacted most often by a tooling mechanism.

DETAILED DESCRIPTION

Figure 1:
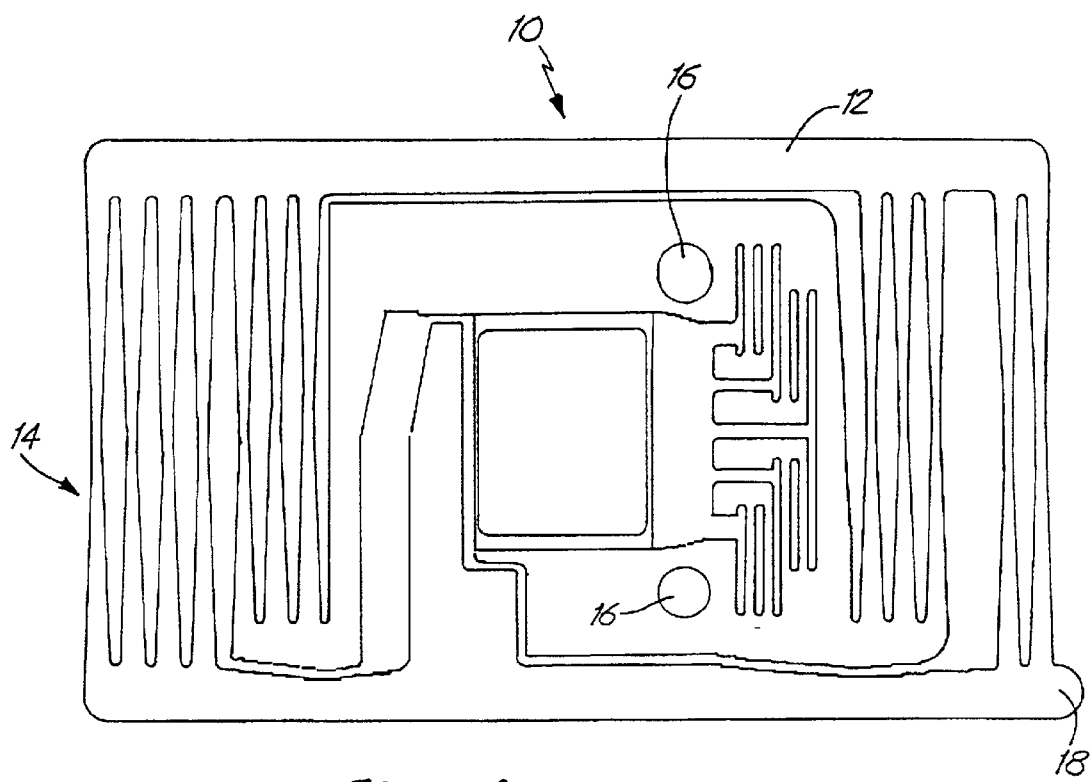
FIG. 1 is a top plan view of one example of a MEMS device which benefits from the present invention.

FIG. 1 is a top plan view of a silicon MEMS device useful in testing sliders. Shown in FIG. 1 is a MEMS device 10 comprising an outer frame 12, several inner springs 14, two circular pin holes 16, a tab 18, and a pedestal 20. The MEMS device 10 functions as a clamp for holding a slider during testing. The slider can be temporarily clamped into the MEMS device 10 on pedestal 20 so that the slider can be flown above a disc, tested, unclamped, and then removed from the MEMS device 10.

The pin holes 16 on the MEMS device 10 align and hold the device 10 on a suspension or fixture (not shown in FIG. 1). The tab 18 provides a location at which pressure can be applied to the MEMS device 10. When pressure is exerted on tab 18, the springs 14 deform to open the clamp and allow the slider to be inserted or removed from pedestal 20 of the MEMS device 10.

Clamping the slider 20 in the MEMS device 10 for testing is preferable to gluing the slider to a fixture for testing. When a slider is glued to a fixture for testing, the slider is typically no longer useable. Using a clamping device, such as the MEMS device 10, allows each slider to be tested, yet remain useful once removed from the clamp. As a result, the MEMS device 10 is repeatedly opened and closed to allow for insertion and removal of the sliders before and after testing of each slider.

MEMS devices such as device 10 are typically formed of silicon using wafer level processing. Once the individual devices 10 are removed from the wafer, the MEMS device 10 must be handled. It is typical for the MEMS device 10 to be contacted by tweezers or similar tooling devices at its outer edge 12, such as when installing the MEMS device 10 on a suspension. When so handled, it is not uncommon for the silicon to chip or crack at the locations where the tweezers contacts the MEMS device 10 outer surface 12.

In addition, the MEMS device 10 is designed so that when installed on a suspension, pins on the suspension extend through the pin holes 16 on the device 10. Each time the MEMS device 10 is opened and closed, the pin holes 16 experience certain stresses. As such, it is also common for the silicon to chip or break near the pin hole 16. Similarly, in opening and closing the clamp 10 to allow a slider to be inserted into the MEMS device 10, pressure is exerted on the tab 18 to deform the springs 14. As a result, the tab 18 is another location on the MEMS device which receives repeated contact and which may chip or otherwise crack.

Any time the MEMS device 10 is chipped or cracked, small amounts of silicon may contaminate the slider held in the MEMS device 10 or may contaminate the disc or other electrical components near the device MEMS 10.

Furthermore, cracks in the MEMS device 10 can develop into more serious structural flaws or even breaks. To overcome the chipping and breakage problem, the present invention involves coating the MEMS device 10 with a ductile material, such as a metal, to prevent and reduce chipping and breakage. This armored coating serves to absorb the stress of repeated contact and prevents the stress from being transferred through the ductile material to the silicon crystals so that the silicon neither fractures, breaks, or chips.

There are two options for providing an armored coating on a MEMS device; total armored coating, and partial armored coating. The first option is to coat the entire surface of a MEMS device with the ductile metal. The second option involves only partially coating selected areas of the device. Providing the MEMS device with an armored coating can be performed at either an individual component level, or more preferably, at the wafer level.

Figure 2A:
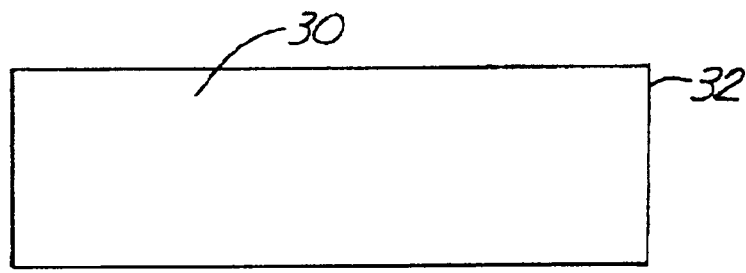
FIGS. 2A–2B are simplified cross-sectional views of the process flow involved in total armored coating of a wafer or component.
Figure 2B:
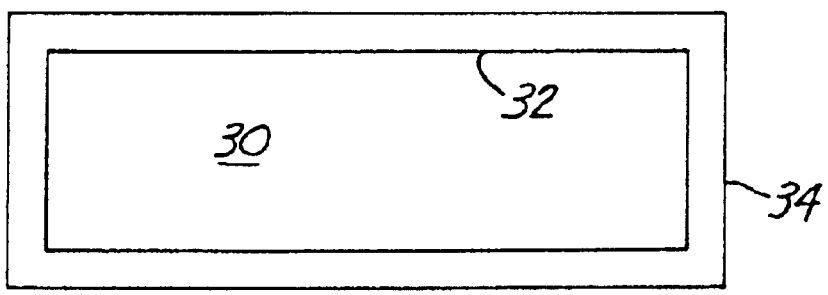

FIGS. 2A–2B are simplified cross-sectional views of a wafer illustrating the process flow for providing micro components with a total armored coating. Shown in FIG. 2A is a wafer substrate 30. In the first step of providing the wafer 30 with armored coating, a conformal coating of a seed layer 32 is deposited on the wafer substrate 30. Any suitable seed layer material may be used, such as Tantalum. In depositing the seed layer 32, it is desirable for the seed layer 32 to be very thin. Typically, the seed layer 32 is sputtered on and is about a few thousand Angstroms thick. The seed layer provides a surface onto which a ductile metal can be deposited.

FIG. 2B shows the step of depositing a soft metal 34 on the wafer 30 over the seed layer 32. Any suitable metal, such as copper, aluminum, or nickel cobalt may be used. Most preferably, suitable metals are ductile and adhere well to silicon. In contrast to the seed layer 32, the armor coating layer 34 is desired to be much thicker, and may be up to 10 microns or even 20 microns thick. However, the thickness of the armor coating 34 may be limited by the amount of stress the coating 34 puts on the features of the MEMS device or on the microcomponents itself. If the metal layer 34 is deposited too thickly, particularly when the layer 34 comprises ductile materials having high tensile or compressive stress, the layer 34 may fail or may rip off of the wafer 30.

Any suitable method may be used to deposit the metal armored coating 34 on the wafer 30. For instance, it is possible to deposit the metal layer 34 using chemical vapor deposition (CVD). In addition, it is possible to sputter the metal coating 34 onto the wafer 30, or to deposit the metal coating 34 using an electroplating process. In coating the wafer 30 with the ductile material 34, it may be possible to coat one surface of the wafer 30, flip the wafer 30 over, and coat the other side of the wafer 30.

The type of metal chosen as well as the method of depositing it on the wafer 30 may depend on the geometric factors of the features on the wafer 30. In particular, for a MEMS device having intricate or fine geometric features, CVD may provide the best deposition method. A CVD process is particularly suited for instances where the coating 34 must evenly coat very small areas, deep recesses, and other features found in connection with intricate geometries. For devices having more coarse features, electroplating or sputtering may be suitable.

The type of metal chosen may also depend on the desired wear characteristics for the device. For instance, surfaces that will receive heavy and repeated contact may benefit from an armored coating 34 comprising a stronger metal such as nickel. In contrast, using a softer metal, such as copper, may be less suitable because when subjected to such repeated contact, the copper may smear or leave residue.

FIGS. 3A–3F are simplified cross-sectional views illustrating the process flow for providing a wafer with partial armored coating. In some instances, the microcomponent or MEMS device does not require a full armor coating due to either space requirements or other electromechanical requirements. In such a situation, only a partial armored coating may be applied.

Figure 3A:
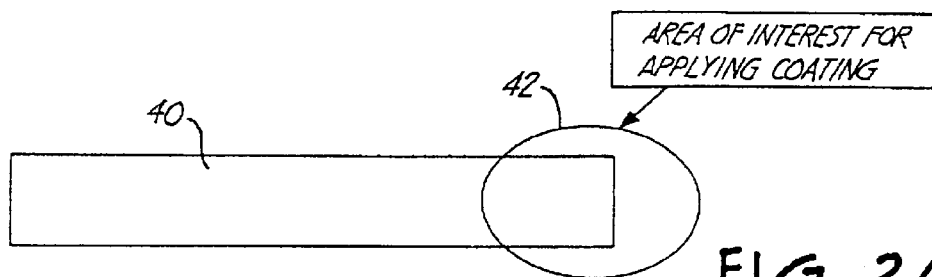
FIGS. 3A–3F are simplified cross-sectional views of the process flow involved in partial armored coating of a wafer or component.
Figure 3B:
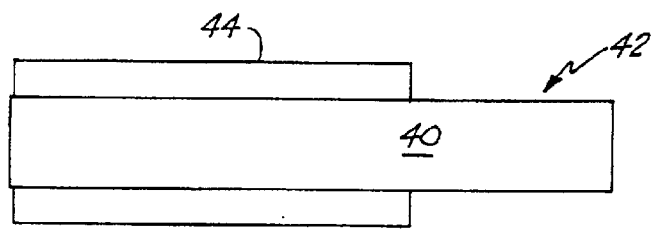
Figure 3C:
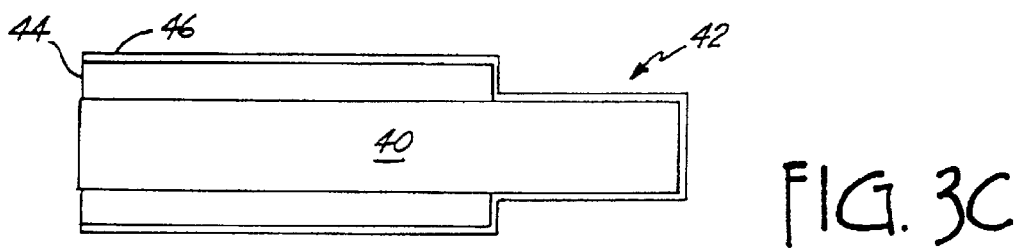

FIG. 3A shows a wafer 40 and an area 42 of the wafer 40 to which it is desired that the armored coating be applied. The first step of applying a partial armored coating to the wafer 40 is shown in FIG. 3B. FIG. 3B illustrates applying photo resist 44 to the wafer 40 on all areas of the wafer 40 but the area 42 which is to be armor coated. Next, as shown in FIG. 3C, a seed layer 46 is deposited on the wafer 40. The seed layer 46 covers both the photo resist 44 as well as the area 42 to be armor coated.

Once again, any suitable seed layer material may be used, such as Tantalum. Also, it is preferable for the seed layer 46 be deposited in a very thin layer, so that it is about a few thousand Angstroms thick.

Figure 3D:
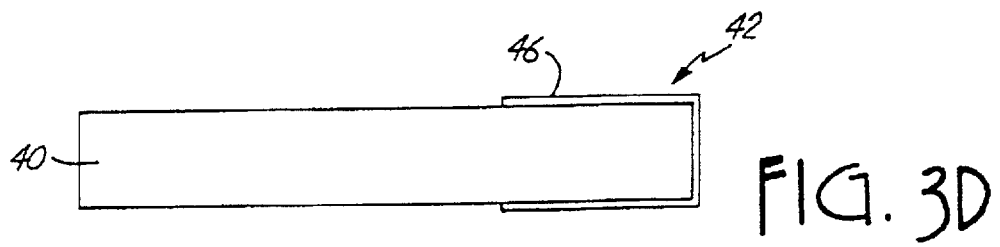

In the next step, as illustrated in FIG. 3D, the photoresist layer 44 is removed, such as by using a wet chemical strip or other suitable means for removing photoresist. Once the photoresist layer 44 is removed, the seed layer 46 remains on the wafer 40 at only the area of interest 42.

Figure 3E:
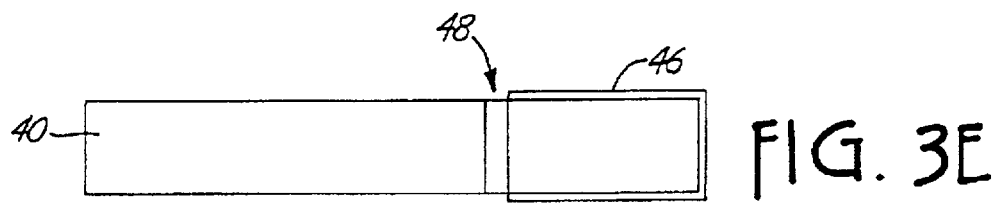

Once the seed layer 46 is deposited on the wafer 40 at only the area of interest 42, further processing may be performed on the wafer 40. For instance, the wafer 40 may undergo additional processes of patterning and etching to form any other required features of the microcomponents. As shown in FIG. 3E, one example of a patterning or etching process that may be performed on the wafer 40 is the formation of a beam 48 using deep trench reactive ion etching. Because the seed layer 46 is so thin, the seed layer 46 does not interfere with any such remaining patterning operations.

Figure 3F:
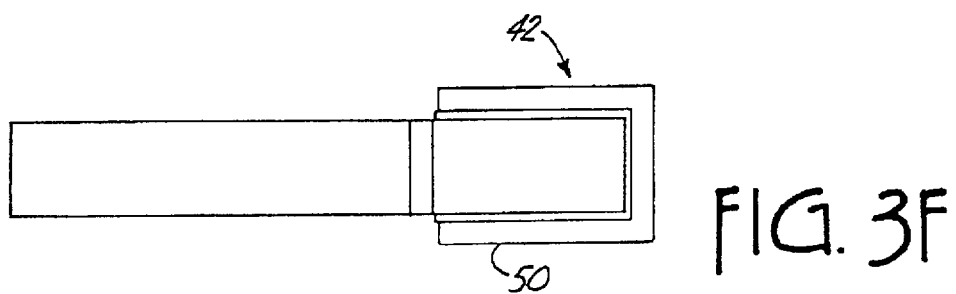

In a final step illustrated in FIG. 3F, a ductile material 50 is applied to the wafer 40. Because the seed layer 46 remains only at the area of interest 42, the ductile material 50 is deposited only at the area of interest 42 as well. As a result, wafer 40 has a partial armored coating at the area of interest 42.

Though disclosed in terms of a clamping device, the present invention is suitable for use on any microcomponent or MEMS device. Furthermore, though disclosed in terms of a wafer level process, the method can likewise suitably be performed on individual components or devices.

Although the present invention has been described with reference to preferred embodiments, workers skilled in the art will recognize that changes may be made in form and detail without departing from the spirit and scope of the invention.

What is claimed is:

1. A microelectromechanical component formed of silicon, the component comprising:
    a feature on the component which is subjected to a repeated mechanical stress; and
    means for increasing robustness of the feature by covering the feature with a ductile material having a thickness of greater than about 10 microns to absorb repeated stress and to reduce breakage or chipping.

2. The component of claim 1 wherein the ductile material comprises a metal.

3. The component of claim 1 wherein means for increasing the robustness of the feature further comprises a coating on the component comprising a ductile material, wherein the coating has a thickness of greater than 10 microns.

4. The component of claim 3 wherein the ductile material comprises a metal.

5. A microcomponent formed of silicon, the microcomponent comprising:
   a feature on the microcomponent which is subjected to a mechanical stress; and
   a ductile material coating the feature to increase robustness of the microcomponent, wherein the ductile material has a thickness of greater than about 10 microns, and absorbs mechanical stress to reduce chipping or breaking near the feature which is subjected to the mechanical stress.

6. The microcomponent of claim 5 wherein the ductile material comprises a metal.

7. The microcomponent of claim 6 and further comprising a seed layer to facilitate the ability of the metal to coat the feature.

8. The microcomponent of claim 6 wherein the metal has a thickness of about 20 microns.

9. The microcomponent of claim 5 and further comprising a ductile material coating substantially the entire surface of the micro component.

10. A method of increasing the robustness and absorbing mechanical stress on a microelectromechanical component to reduce chipping or breaking of the component, the method comprising:
    forming the microelectromechanical component from silicon; and
    coating a selected area on the component which is subjected to a mechanical stress with ductile material so that the ductile material has a thickness of greater than about ten microns.

11. The method of claim 10 wherein forming the component from silicon comprises forming a plurality of components from a silicon wafer.

12. The method of claim 11 wherein coating the component with a ductile material comprises coating a preselected area of the component with a metal.

13. The method of claim 12 wherein coating a preselected area of the component with a metal comprises:
    applying photo resist to the component to define an area to which the metal will be applied;
    depositing a seed layer on the component;
    removing the photo resist so that the seed layer remains only in the area to which the metal will be applied; and
    applying a metal coating to the seed layer.

14. The method of claim 13 wherein applying the metal coating to the seed layer comprises using a chemical vapor deposition process.

15. The method of claim 13 wherein applying the metal coating to the seed layer comprises using an electroplating process.

16. The method of claim 13 wherein applying the metal coating to the seed layer comprises using a sputtering process.

17. The method of claim 13 wherein applying the metal coating comprises applying the metal coating to a thickness of up to about 20 microns.

18. A micro-electro-mechanical component formed of silicon, the component comprising:
    a feature on the component which is subjected to a mechanical stress; and
    a coating on the feature to increase the robustness thereof by covering the feature and absorbing repeated stress to reduce breakage or chipping, the coating comprising a ductile metal having a thickness of greater than about 10 microns.

19. The micro-electro-mechanical component of claim 18 further comprising a seed layer to facilitate the ability of the metal to coat the feature.

20. The micro-electro-mechanical component of claim 18 wherein the ductile metal coating the feature prevents the silicon from chipping or breaking near the feature which is subjected to a mechanical stress.

21. The micro-electro-mechanical component of claim 18 wherein the coating comprising a ductile metal coats substantially the entire surface of the component.

* * * * *

UNITED STATES PATENT AND TRADEMARK OFFICE
CERTIFICATE OF CORRECTION

PATENT NO. : 6,710,417 B2
DATED : March 23, 2004
INVENTOR(S) : Zine-Eddine Boutaghou et al.

It is certified that error appears in the above-identified patent and that said Letters Patent is hereby corrected as shown below:

Column 1,
Line 21, delete "modem" insert -- modern --

Signed and Sealed this

Fourth Day of January, 2005

JON W. DUDAS
*Director of the United States Patent and Trademark Office*